United States Patent
Bhakta et al.

(10) Patent No.: US 6,636,120 B2
(45) Date of Patent: Oct. 21, 2003

(54) DECIMATED DIGITAL PHASE-LOCKED LOOP FOR HIGH-SPEED IMPLEMENTATION

(75) Inventors: Bhavesh G. Bhakta, Plano, TX (US); Younggyun Kim, Irvine, CA (US)

(73) Assignee: Texas Instruments Incorporated, Dallas, TX (US)

( * ) Notice: Subject to any disclaimer, the term of this patent is extended or adjusted under 35 U.S.C. 154(b) by 113 days.

(21) Appl. No.: 09/991,680

(22) Filed: Nov. 21, 2001

(65) Prior Publication Data

US 2002/0075078 A1 Jun. 20, 2002

Related U.S. Application Data

(60) Provisional application No. 60/252,959, filed on Nov. 24, 2000.

(51) Int. Cl.[7] .......................... H03L 7/093; H03L 7/085
(52) U.S. Cl. .................. 331/17; 331/14; 331/1 A; 327/156; 327/159; 360/51
(58) Field of Search ............................ 331/1 A, 14, 17, 331/18, 25; 327/156–159; 332/127; 360/51; 375/376; 455/260

(56) References Cited

U.S. PATENT DOCUMENTS

| | | | |
|---|---|---|---|
| 4,130,839 A | * 12/1978 | McCullough | 358/469 |
| 5,243,605 A | 9/1993 | Lekmine et al. | |
| 5,278,703 A | 1/1994 | Rub et al. | |
| 5,321,559 A | 6/1994 | Nguyen et al. | |
| 5,485,472 A | 1/1996 | Fredrickson | |
| 5,552,942 A | * 9/1996 | Ziperovich et al. | 360/51 |
| 5,644,743 A | 7/1997 | Barrett, Jr. et al. | |
| 5,731,768 A | 3/1998 | Tsang | |
| 5,745,315 A | 4/1998 | Aoyama | |
| 5,771,127 A | 6/1998 | Reed et al. | |
| 5,790,611 A | 8/1998 | Huang et al. | |
| 5,812,619 A | 9/1998 | Runaldue | |
| 5,936,558 A | 8/1999 | Shafiee et al. | |
| 6,233,284 B1 | * 5/2001 | Townshend | 375/242 |
| 6,377,127 B1 | * 4/2002 | Fukaishi | 331/17 |

OTHER PUBLICATIONS

Younggyun Kim et al., "Delay–Constrained Asymptotically Optimal Detection using Signal–Space Partioning", IEEE, 1998, pp. 673–677.

Jan W. M. Bergmans et al., "On the Performance of Data Receivers with a Restricted Detectin Delay", IEEE Transactions on Communications, vol. 42, No. 6, Jun. 1994, pp. 2315–2324.

Jaekyun Moon et al., "Performance Comparision of Detection Methods in Magnetic Recording", IEEE Transactions on Magnetics, vol. 26, No. 6, Nov. 1990 pp. 3155–3172.

Takushi Nishiya et al., "Turbo–EEPRML: An EEPR4 Channel with an Error–Correcting Post–Processor Designed for 16/17 Rate Quasi–Mtr Code", IEEE, 1998, pp. 2706–2711.

Hamid Shafiee et al., "Low–Complexity Viterbi Deteciton for a Family of Partial Response Systems", IEEE Tranactions on Magnetic, vol. 28, No. 5, Sep. 1992 pp. 2892–2894.

F. Dolivo et al., "Fast Timing Recovery for Partial–Response Signaling Systems", IEEE, 1989, pp. 0573–0577.

* cited by examiner

*Primary Examiner*—David C. Mis
(74) *Attorney, Agent, or Firm*—W. Daniel Swayze, Jr.; W. James Brady; Frederick J. Telecky, Jr.

(57) ABSTRACT

A phase lock loop to control phase error from a first input signal and a second input signal including a phase error detector to detect a phase error signal between the first input signal and the second input signal at a predetermined rate, a down-sampling circuit to down-sample the phase error signal and to output a down-sampled signal at a reduced rate with respect to the predetermined rate, a loop filter to filter the down-sampled signal to obtain a filtered signal, and an up-sampling circuit to up-sample the filtered signal at the predetermined rate.

4 Claims, 3 Drawing Sheets

DECIMATED DIGITAL PHASE-LOCKED LOOP FOR HIGH-SPEED IMPLEMENTATION

This application claims priority under 35 USC §119(e)(1) of provisional application Ser. No. 60/252,959, filed Nov. 24, 2000.

FIELD OF THE INVENTION

The present invention relates to clock recovery and data extraction and, more particularly, to clock recovery and data extraction using digital circuitry.

BACKGROUND OF THE INVENTION

A typical disk drive includes one or more disks mounted for rotation on a hub or spindle. A typical disk drive also includes a transducer supported by a hydrodynamic air bearing which flies above each disk. The transducer and the hydrodynamic air bearing are collectively referred to as a data head. A drive controller is conventionally used for controlling the disk drive based on commands received from a host system. The drive controller controls the disk drive to retrieve information from the disks and to store information on the disks.

In one conventional disk drive, an electromechanical actuator operates within a negative feedback, closed-loop servo system. The actuator moves the data head radially over the disk surface for track seek operations and holds the transducer directly over a track on the disk surface for track following operations.

Information is typically stored in concentric tracks on the surface of the disks by providing a write signal to the data head to write information on the surface of the disk representing the data to be stored. In retrieving data from the disk, the drive controller controls the electromechanical actuator so that the data head flies above the disk and generates a read signal based on information stored on the disk. The read signal is typically conditioned and then decoded by the drive controller to recover the data.

A typical read channel includes the data head, preconditioning logic (such as preamplification circuitry and filtering circuitry), a data detector and recovery circuit, and error detection and correction circuitry. The read channel is typically implemented in a drive controller associated with the disk drive. This data is typically implemented on integrated circuits and, correspondingly, the clock distribution within the integrated circuit requires precise phase correlation. This is to ensure that there is proper setup and processing of the digital information within the integrated circuit.

The timing requirements of multiple integrated circuits of a digital system also require equally precise phase correlation. Reliable operation of the integrated circuit depends on the data being stable when a clock signal is received. If the clock signal is out of phase, then the data may no longer be valid. This is also true when transferring signals between multiple integrated circuits.

Digital signals propagate through a plurality of combinatorial gate logic, shift registers, storage registers, transmission media, and encounter other propagation delays due to circuit capacitance, inductance, and signal path distances within or between integrated circuits. All electronic circuits have resistance, inductance, and capacitance inherent within the physical structure of the electronic circuit. Integrated circuit devices have predominately resistance and capacitance. The resistance (R) and capacitance (C) create an RC time constant delay to a fast rising edge square wave such as a clock signal. When clock signal delays are different between different areas of the integrated circuit, then the difference between the signal delays or phase difference is called "skew." Differences in clock signal delays are usually caused by differences in capacitance associated with the different circuit loads requiring the clock signal. As speed of digital signals increases, skew becomes a more significant problem.

Digital phase-locked loops (DPLL) or, more generally, phase-locked loops (PLL) are utilized with ASIC state machines in both read channel, communication and computer applications. The DPLL includes a series of delay elements that are selectable. A received digital signal is compared against a reference clock signal. The phase difference between the signals is determined by a phase detector of the DPLL, and the appropriate amount of delay that is added to the digital signal until the phase difference between signals is minimal or substantially 90 degrees in accordance with the particular application. The DPLL does not change the received digital signal; it only delays the signal by a discrete amount.

Precise control of the phase delay of digital signals in a digital system such as a DPLL requires a plurality of digital phase delay circuits. The number of delay circuits required depends on the phase granularity required in the system. For example, one degree phase increments requires utilizing 359 different delay circuits. These delay circuits may be configured into coarse and fine phase delay steps when the coarse steps are made in one delay circuit and fine steps between each coarse step are made in another delay circuit.

A PLL, which is the more general case of a DPLL, usually includes a phase comparator to receive incoming data, typically in Manchester format. The phase comparator determines whether the received data lags or leads a reference clock. When the data lags the reference clock, the comparator issues a down adjust signal to a charge pump and, conversely, when the data leads the reference clock, the phase comparator issues an up adjust signal to the charge pump. The charge pump then removes or adds charge to the circuit, acting like an integrator by issuing a voltage signal to a voltage-to-frequency oscillator (VCO) circuit.

The VCO circuit receives the voltage signal and adjusts its frequency of operation accordingly. However, data tends to jitter in real system operation. Edges of data can bounce around within a limit of 18 Ns and still be within the IEEE specifications for Manchester data. A feedback loop of the PLL is intended to make the adjustment to the VCO to track the average mean of the jittering.

The PLL further includes a loop filter that is typically a low-pass filter and acts as a dampening circuit.

FIG. 1 illustrates an implementation of a DPLL. The structure of the PLL includes a loop filter 100 designated by LF. The VCO is the voltage-controlled oscillator 110, and the phase error detector 120 is designated by PED. The phase error detector 120 provides an estimate of the timing phase error. Typically, the loop filter 100 and voltage-controlled oscillator 110 has low-pass characteristics so that rapid variation in the phase error estimate can be removed. Thus, the sample phase illustrated by switch 130 is adjusted in accordance with the output of the voltage-controlled oscillator 110.

For high-speed applications, various implementation techniques, such as parallel processing and pipelining, have been adopted for speeding up the operation of the hardware devices. These implementation techniques, however, create increased hardware complexity and significant loop latency.

SUMMARY OF THE INVENTION

With the present invention, the input signal of the PLL can be resampled (decimated) with a lower rate, and then the PLL operates with a lower clock rate without affecting the overall performance. The PLL attempts to detect phase variation which is typically slow with respect to the sampling rate. Therefore, the present invention can employ a resampling rate which is lowered significantly from the sampling rate without affecting the performance of the PLL. This technique increases hardware speed without increasing hardware complexity and latency. The present invention illustrates a half-sampling rate; however, a ¼ or ⅓ sampling rate could be implemented without departing from the scope of the present invention.

DETAILED DESCRIPTION OF THE PRESENT INVENTION

The following invention is described with reference to figures in which similar or the same numbers represent the same or similar elements. While the invention is described in terms for achieving the invention's objectives, it can be appreciated by those skilled in the art that variations may be accomplished in view of these teachings without deviation from the spirit or scope of the invention.

Figure 5:
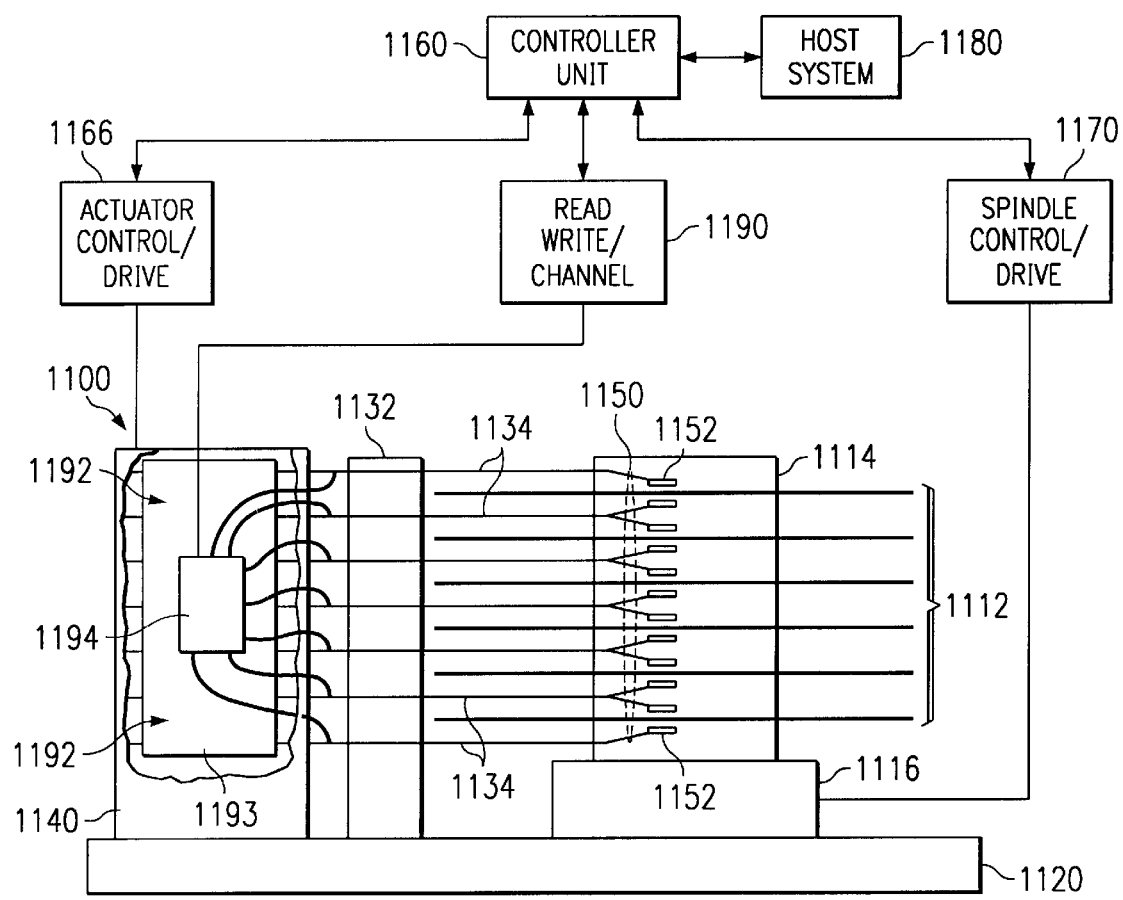
FIG. 5 is a side view of a disk drive system.
Figure 6:
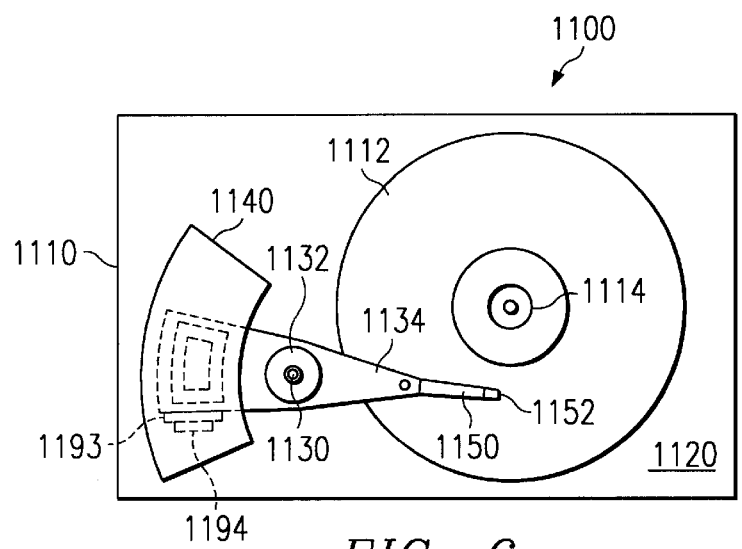
FIG. 6 is a top view of a disk drive system.

FIGS. 5 and 6 show a side and top view, respectively, of the disk drive system designated by the general reference 1100 within an enclosure 1110. The disk drive system 1100 includes a plurality of stacked magnetic recording disks 1112 mounted to a spindle 1114. The disks 1112 may be conventional particulate or thin film recording disk or, in other embodiments, they may be liquid-bearing disks. The spindle 1114 is attached to a spindle motor 1116 which rotates the spindle 1114 and disks 1112. A chassis 1120 is connected to the enclosure 1110, providing stable mechanical support for the disk drive system. The spindle motor 1116 and the actuator shaft 1130 are attached to the chassis 1120. A hub assembly 1132 rotates about the actuator shaft 1130 and supports a plurality of actuator arms 1134. The stack of actuator arms 1134 is sometimes referred to as a "comb." A rotary voice coil motor 1140 is attached to chassis 1120 and to a rear portion of the actuator arms 1134.

A plurality of head suspension assemblies 1150 are attached to the actuator arms 1134. A plurality of inductive transducer heads 1152 are attached respectively to the suspension assemblies 1150, each head 1152 including at least one inductive write element. In addition thereto, each head 1152 may also include an inductive read element or a MR (magneto-resistive) read element. The heads 1152 are positioned proximate to the disks 1112 by the suspension assemblies 1150 so that during operation, the heads are in electromagnetic communication with the disks 1112. The rotary voice coil motor 1140 rotates the actuator arms 1134 about the actuator shaft 1130 in order to move the head suspension assemblies 1150 to the desired radial position on disks 1112.

A controller unit 1160 provides overall control to the disk drive system 1100, including rotation control of the disks 1112 and position control of the heads 1152. The controller unit 1160 typically includes (not shown) a central processing unit (CPU), a memory unit and other digital circuitry, although it should be apparent that these aspects could also be enabled as hardware logic by one skilled in the computer arts. Controller unit 1160 is connected to the actuator control/drive unit 1166 which is in turn connected to the rotary voice coil motor 1140. A host system 1180, typically a computer system or personal computer (PC), is connected to the controller unit 1160. The host system 1180 may send digital data to the controller unit 1160 to be stored on the disks, or it may request that digital data at a specified location be read from the disks 1112 and sent back to the host system 1180. A read/write channel 1190 is coupled to receive and condition read and write signals generated by the controller unit 1160 and communicate them to an arm electronics (AE) unit shown generally at 1192 through a cut-away portion of the voice coil motor 1140. The read/write channel 1190 includes the PLL of the present invention. The AE unit 1192 includes a printed circuit board 1193, or a flexible carrier, mounted on the actuator arms 1134 or in close proximity thereto, and an AE module 1194 mounted on the printed circuit board 1193 or carrier that comprises circuitry preferably implemented in an integrated circuit (IC) chip including read drivers, write drivers, and associated control circuitry. The AE module 1194 is coupled via connections in the printed circuit board to the read/write channel 1190 and also to each read head and each write head in the plurality of heads 1152.

With the present invention, the input to the PLL is resampled (decimated) with a lower rate, and then the PLL operates with a lower clock rate without affecting performance.

For high-speed operation, the timing recovery loop operates at a clock with a period of 2T where T is the sampling period. More specifically, the loop filter (LF), the voltage-controlled oscillator (VCO), and the phase update circuit for the sampler work at a half rate of the sampling clock. If the combination of loop filter, voltage-controlled oscillator, and phase update circuit is a linear operation, a band-limited phase error detector output from the phase error detector can be down-sampled and processed at a lower clock rate by the loop filter, voltage-controlled oscillator, and phase update circuit and subsequently up-sampled to the original clock rate without losing any information or affecting operation.

Figure 3:
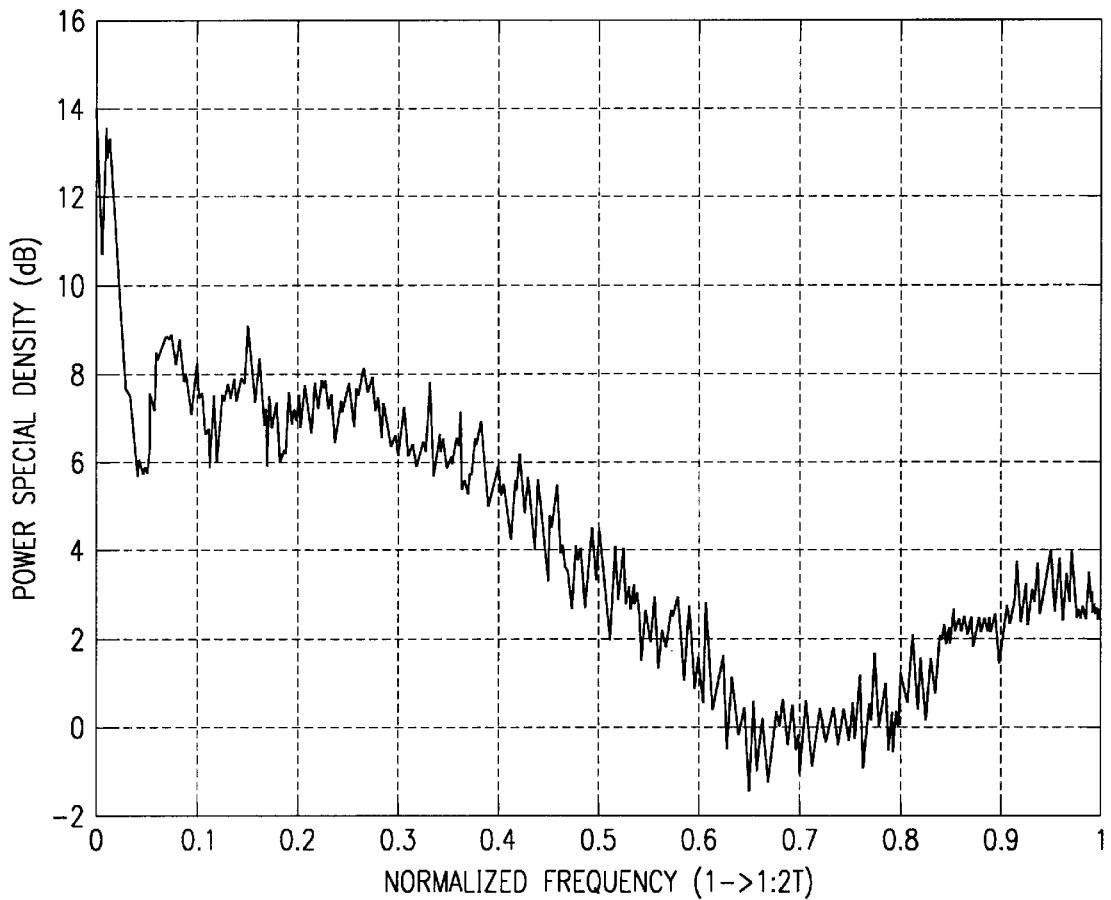
FIG. 3 illustrates a power spectral density of a phase error detector.

The output of a phase error detector is shown in FIG. 3; more specifically, power spectral density is shown. As can be seen, most of the power of the output signal from the phase error detector is concentrated at low-frequency region being close to DC. The combination of loop filter and voltage-controlled oscillator tends to remove the high-frequency component from the output signal of the phase error detector. For a digital phase-locked loop, the combination of loop filter, VCO, and phase update is a linear operation. Therefore, the output of the phase error detector can be decimated by a half rate and processed by the loop filter, VCO, and phase update circuit without affecting the performance of the DPLL. Since the sampler phase is assumed to be updated at every other clock, the up-sampler (for example, an interpolator) employs a filter with a unit-delta function for a response. Low-pass filtering applied before the down-sampler prevents aliasing effects.

Figure 1:
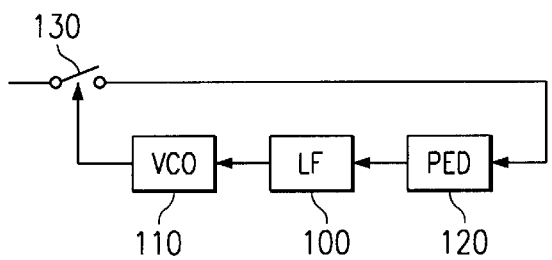
FIG. 1 illustrates a phase-locked loop.
Figure 2:
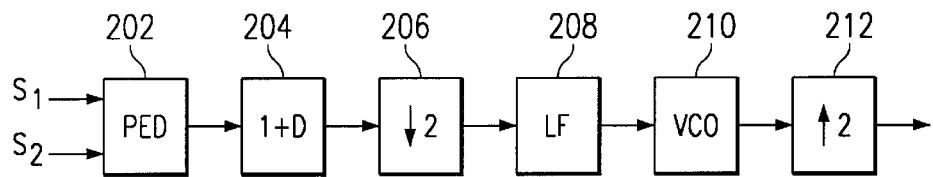
FIG. 2 illustrates a PLL of the present invention.

FIG. 2 illustrates a DPLL of the present invention. Element 204 is a low-pass filter with a cutoff frequency other than ¼T. This low-pass filter 204 effectively averages the output from the phase error detector. Two samples are input to phase error detector 202. The phase error detector 202 performs phase error operations to detect a phase error between the two input sampled samples. An output signal from the phase error detector circuit 202 indicates the phase error between the two inputs. The low-pass filter 204 adds a current phase error with a phase error that has been time delayed to prevent information being lost as a result of the operation of the down-sampler 206. The output of low-pass filter 204 is a filtered phase error signal which is input to down-sampler 206. Down-sampler 206 samples the filtered phase error signal from every other input sample and outputs this down-sampled signal from the down-sampler 206. Other rates including ⅓T and ¼T may be used with the present invention. Thus, this down-sampler operation effectively reduces the clock rate of the phase error signal by a factor of two. The loop filter 208 filters the down-sampled signal and outputs a filtered down-sampled signal. The filtered down-sampled signal is input to voltage-controlled oscillator 210. The voltage-controlled oscillator 210 consequently operates at a half clock rate. The phase update is performed every 2T period which is represented by the interpolation by the up-sampler circuit 212 which may use a filter and a unit-delta function as its response. The up-sample circuit 212 up-samples the signal back to the original sampling rate.

The performance of a timing recovery loop adopting the decimation approach (for example, the 2T-clock operation) as illustrated in FIG. 2 has been compared with a prior art timing loop (for example, 1T-clock operation). A second order digital phase-licked loop has been used. The loop parameters (proportional and integral path gains) have been optimized separately for 1T- and 2T-clock operations to reflect the different latencies of the loop. The loop latency of M for 1T-clock is regarded as M/2 in 2T-clock operation.

Figure 4A:
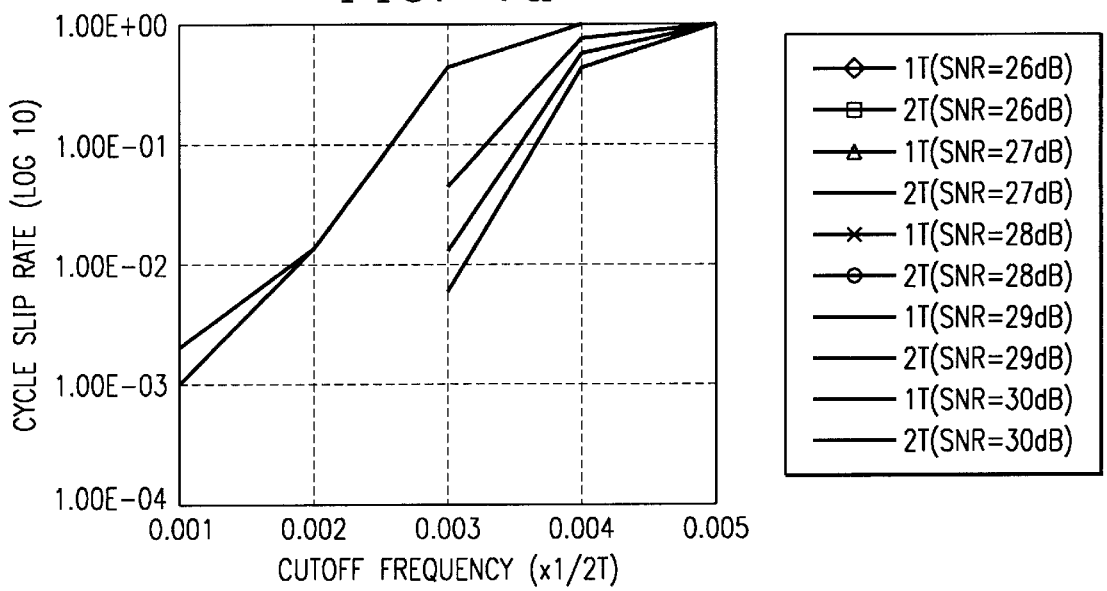
FIG. 4(a) illustrates simulation results of the present invention.
Figure 4B:
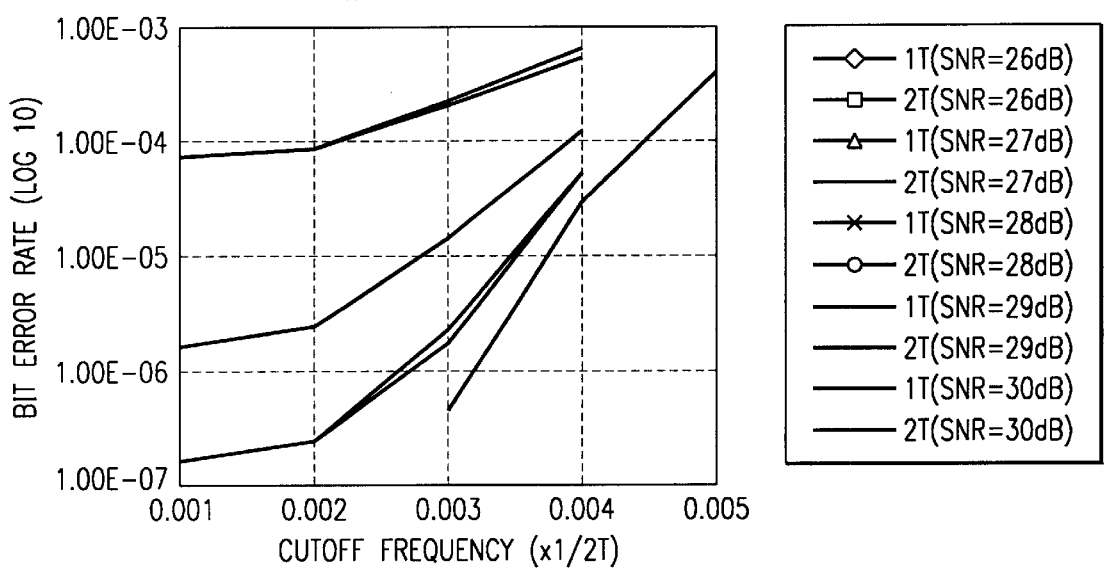
FIG. 4(b) illustrates additional simulation results of the present invention.

Cycle slip and bit error rates have been obtained from computer simulations. The slip rate is detected when the phase error from the phase error detector 202 deviates from a predetermined or ideal sampling point by more than 0.5T. The bit error rate is measured at the output of a channel symbol detector (not shown) whose input is the sampler output. To simulate the phase variation, random noise is generated and passed through an ideal brick-wall low-pass filter with predetermined cutoff. These simulation results are shown in FIG. 4a and FIG. 4b. The variance of the phase variation is fixed to $0.04T^2$ for all situations. No frequency offset is assumed. To simulate varying phase variation, different cutoff frequencies of the low-pass filter have been implemented. In both cycle slip rate and bit error rate, the timing loop performance of 2T-clock operation does not have a significant difference from that of 1T-clock operation.

What is claimed is:

1. A phase lock loop to control phase error from a first input signal and a second input signal, comprising
    a phase error detector to detect a phase error signal between said first input signal and said second input signal at a predetermined rate;
    a down-sampling circuit to down-sample said phase error signal and to output a down-sampled signal at a reduced rate with respect to said predetermined rate;
    a loop filter to filter said down-sampled signal to a filtered signal; and
    an up-sampling circuit to up-sample said filtered signal at said predetermined rate.

2. A phase lock loop as in claim 1, wherein aid reduced rate is ½ said predetermined rate.

3. A phase lock loop as in claim 1, wherein said reduced rate is ⅓ said predetermined rate.

4. A phase lock loop as in claim 1, wherein said reduced rate is ½ said predetermined rate.

* * * * *